(12) United States Patent
Watanabe (10) Patent No.: US 8,619,231 B2
(45) Date of Patent: Dec. 31, 2013

(54) CLEANING METHOD, EXPOSURE METHOD, AND DEVICE MANUFACTURING METHOD

(75) Inventor: Shunji Watanabe, Tokyo (JP)

(73) Assignee: Nikon Corporation, Tokyo (JP)

(*) Notice: Subject to any disclaimer, the term of this patent is extended or adjusted under 35 U.S.C. 154(b) by 334 days.

(21) Appl. No.: 12/781,211

(22) Filed: May 17, 2010

(65) Prior Publication Data

US 2010/0321667 A1 Dec. 23, 2010

Related U.S. Application Data

(60) Provisional application No. 61/213,263, filed on May 21, 2009.

(51) Int. Cl.
*G03B 27/52* (2006.01)
*G03F 7/20* (2006.01)

(52) U.S. Cl.
CPC ........ *G03F 7/70925* (2013.01); *G03F 7/70341* (2013.01)
USPC .............................................. 355/30; 355/77

(58) Field of Classification Search
CPC .......................... G03F 7/70925; G03F 7/70341
USPC ...................................................... 355/30, 77
See application file for complete search history.

(56) References Cited

U.S. PATENT DOCUMENTS

| | | | |
|---|---|---|---|
| 6,208,407 B1 | 3/2001 | Loopstra | |
| 2002/0092543 A1* | 7/2002 | Vaartstra | 134/2 |
| 2005/0219481 A1* | 10/2005 | Cox et al. | 355/18 |
| 2005/0280791 A1 | 12/2005 | Nagasaka et al. | |
| 2006/0098177 A1 | 5/2006 | Nagasaka | |
| 2006/0231206 A1 | 10/2006 | Nagasaka et al. | |
| 2007/0146663 A1 | 6/2007 | Nagasaka | |
| 2008/0018867 A1* | 1/2008 | Fujiwara et al. | 355/30 |
| 2008/0156356 A1 | 7/2008 | Nagasaka et al. | |
| 2008/0271747 A1 | 11/2008 | De Jong et al. | |
| 2008/0273181 A1* | 11/2008 | De Jong et al. | 355/30 |
| 2009/0015805 A1* | 1/2009 | Jansen et al. | 355/30 |
| 2009/0027635 A1 | 1/2009 | De Jong et al. | |
| 2009/0027636 A1 | 1/2009 | Leenders et al. | |
| 2009/0195761 A1* | 8/2009 | De Graaf et al. | 355/30 |

FOREIGN PATENT DOCUMENTS

| | | |
|---|---|---|
| EP | 1 420 298 A2 | 5/2004 |
| EP | 1 598 855 A1 | 11/2005 |
| EP | 1 632 991 A1 | 3/2006 |
| EP | 1 703 548 A1 | 9/2006 |
| EP | 1 821 337 A1 | 8/2007 |
| JP | A-2004-172573 | 6/2004 |
| JP | A-2005-294846 | 10/2005 |
| JP | A-2009-33161 | 2/2009 |

(Continued)

OTHER PUBLICATIONS

International Search Report issued in International Patent Application No. PCT/JP2010/058845 dated Jul. 26, 2010.

(Continued)

*Primary Examiner* — Steven Whitesell Gordon
(74) *Attorney, Agent, or Firm* — Oliff & Berridge, PLC (57) ABSTRACT

A cleaning method includes cleaning a member, used at the time of exposing a substrate via liquid, which is in contact with the liquid. The method includes cleaning the member with an alkali solution followed by cleaning the member with a solution including hydrogen peroxide.

8 Claims, 7 Drawing Sheets

(56) References Cited

FOREIGN PATENT DOCUMENTS

| | | |
|---|---|---|
| JP | A-2009-177143 | 6/2009 |
| JP | A-2009-177143 | 8/2009 |
| WO | WO 99/49504 A1 | 9/1999 |
| WO | WO 00/71268 A1 | 11/2000 |
| WO | WO 2004/019128 A2 | 3/2004 |
| WO | WO 2004/055803 A1 | 7/2004 |
| WO | WO 2004/057590 A1 | 7/2004 |
| WO | WO 2004/086468 A1 | 10/2004 |
| WO | WO 2004/105106 A1 | 12/2004 |
| WO | WO 2005/029559 A1 | 3/2005 |
| WO | WO 2005/067013 A1 | 7/2005 |
| WO | WO 2008/069211 A1 | 6/2008 |

OTHER PUBLICATIONS

Written Opinion of the International Searching Authority issued in International Patent Application No. PCT/JP2010/058845 dated Jul. 26, 2010.

Jun. 5, 2013 Office Action issued in Chinese Patent Application No. 201080021725.9 (with translation).

Jun. 19, 2013 Office Action issued in Korean Patent Application No. 2011-7027536 (with translation).

Mar. 12, 2013 Office Action issued in Japanese Patent Application 2011-549383 (w/translation).

* cited by examiner

CLEANING METHOD, EXPOSURE METHOD, AND DEVICE MANUFACTURING METHOD

CROSS-REFERENCE TO RELATED APPLICATION

This application is a non-provisional application claiming priority to and the benefit of U.S. Provisional Application No. 61/213,263, filed May 21, 2009. The entire contents of which are incorporated herein by reference.

BACKGROUND

The present invention relates to a method of cleaning a member, used at the time of exposing a substrate via liquid, which is in contact with the liquid. Further, the invention relates to an exposure method of exposing the substrate via the liquid and a device manufacturing method.

In a photolithography process at the time of a manufacturing process of micro-devices such as semiconductor devices and liquid crystal display devices, patterns formed on a mask by illuminating the mask with exposure light are projected and exposed on a photosensitive substrate. In response to the increasing high density of micro-devices in recent years, substantial miniaturization of the patterns formed on the substrate in the photolithography process has been demanded. As one means for realizing such miniaturization of the patterns, a liquid immersion method as disclosed in PCT International Publication No. WO 99/49504 has been proposed in which the light path space of exposure light located between a projection optical system and a substrate is filled with liquid, and the substrate is exposed via the liquid.

SUMMARY

In the case of performing exposure using the liquid immersion method, when a foreign substance adheres to members which are in contact with liquid, such as a nozzle member for supplying the liquid, there is a possibility that these members may be unable to maintain the desired performance. In addition, when the members which are in contact with the liquid are contaminated, there is a possibility that the liquid may be contaminated by contacting the members. When the contaminated liquid is filled in the light path space of the exposure light, the mask pattern image is deteriorated, and thus the desired exposure accuracy is not obtained.

An object of some aspects of the present invention is to provide a method of cleaning a member which is in contact with a liquid. In addition, another object thereof is to provide an exposure method capable of performing an exposure process with good accuracy via the liquid, and a device manufacturing method.

According to a first aspect of the present invention, provided is a method of cleaning a member, used at the time of exposing the substrate via liquid, which is in contact with the liquid, the method including cleaning the member with an alkali solution followed by cleaning the member with a solution including hydrogen peroxide.

According to a second aspect of the present invention, an exposure method is provided, including: exposing a substrate by illuminating the substrate with exposure light via liquid; and cleaning a member which is in contact with the liquid by using the cleaning method according to the first aspect.

According to a third aspect of the present invention, a device manufacturing method using the exposure method according to the second aspect is provided.

According to some aspects of the present invention, the members which are in contact with the liquid in the liquid immersion exposure method are configured so that the contaminants adhered to the surfaces of the members are removed, and thus the desired performance of the members can be maintained. In addition, it is possible to prevent the liquid contacting the members from being contaminated. As a result, it is possible to prevent the mask pattern image from being deteriorated, and to maintain the desired exposure accuracy.

DESCRIPTION OF EMBODIMENTS

The embodiment of the present invention relates to a cleaning method of a member which is in contact with liquid to be used at the time of exposing a substrate through the liquid, an exposure method including the cleaning method, and a device manufacturing method.

Figure 1:
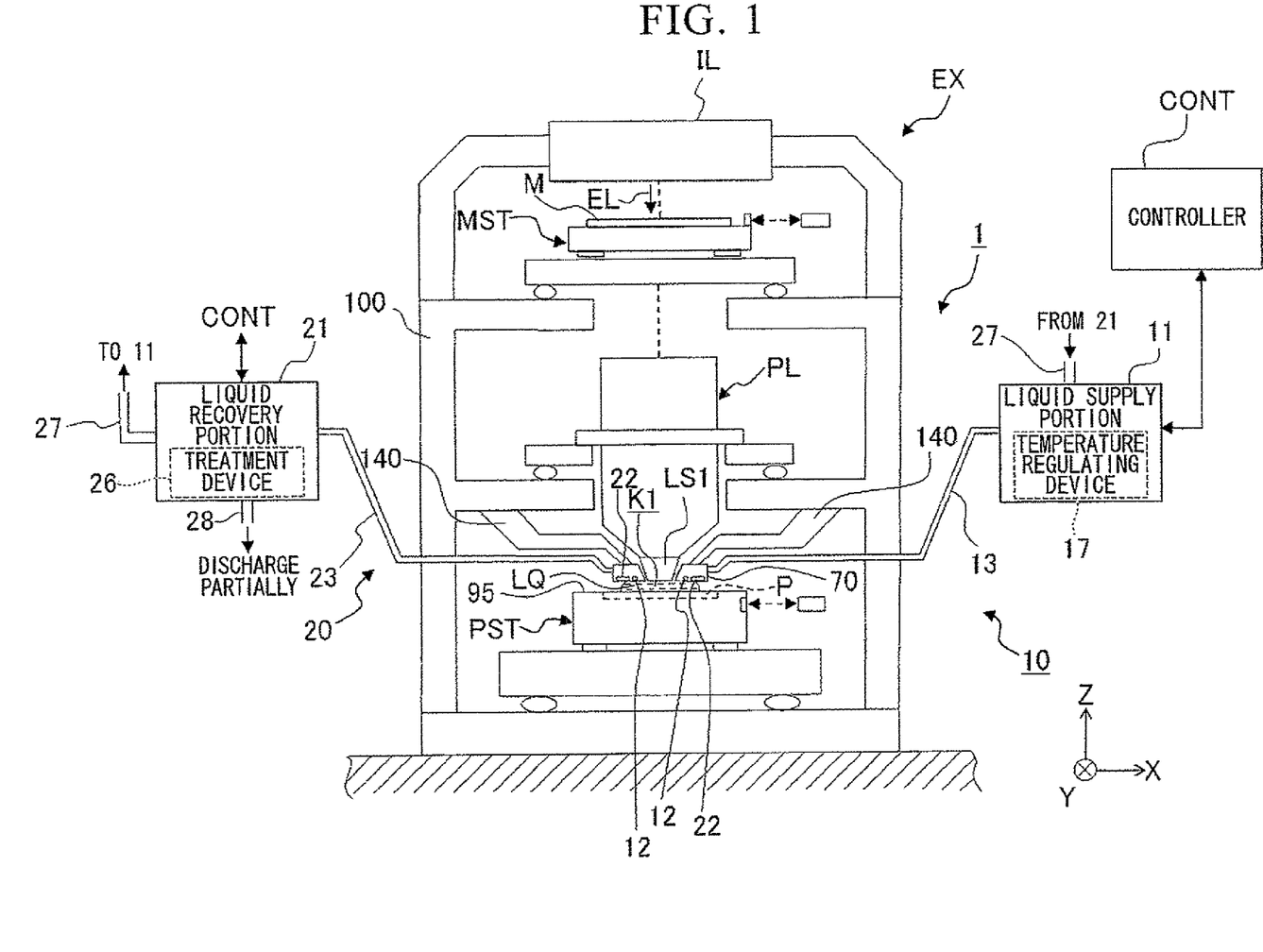
FIG. 1 is a schematic configuration diagram of an exposure apparatus according to an embodiment.
Figure 2:
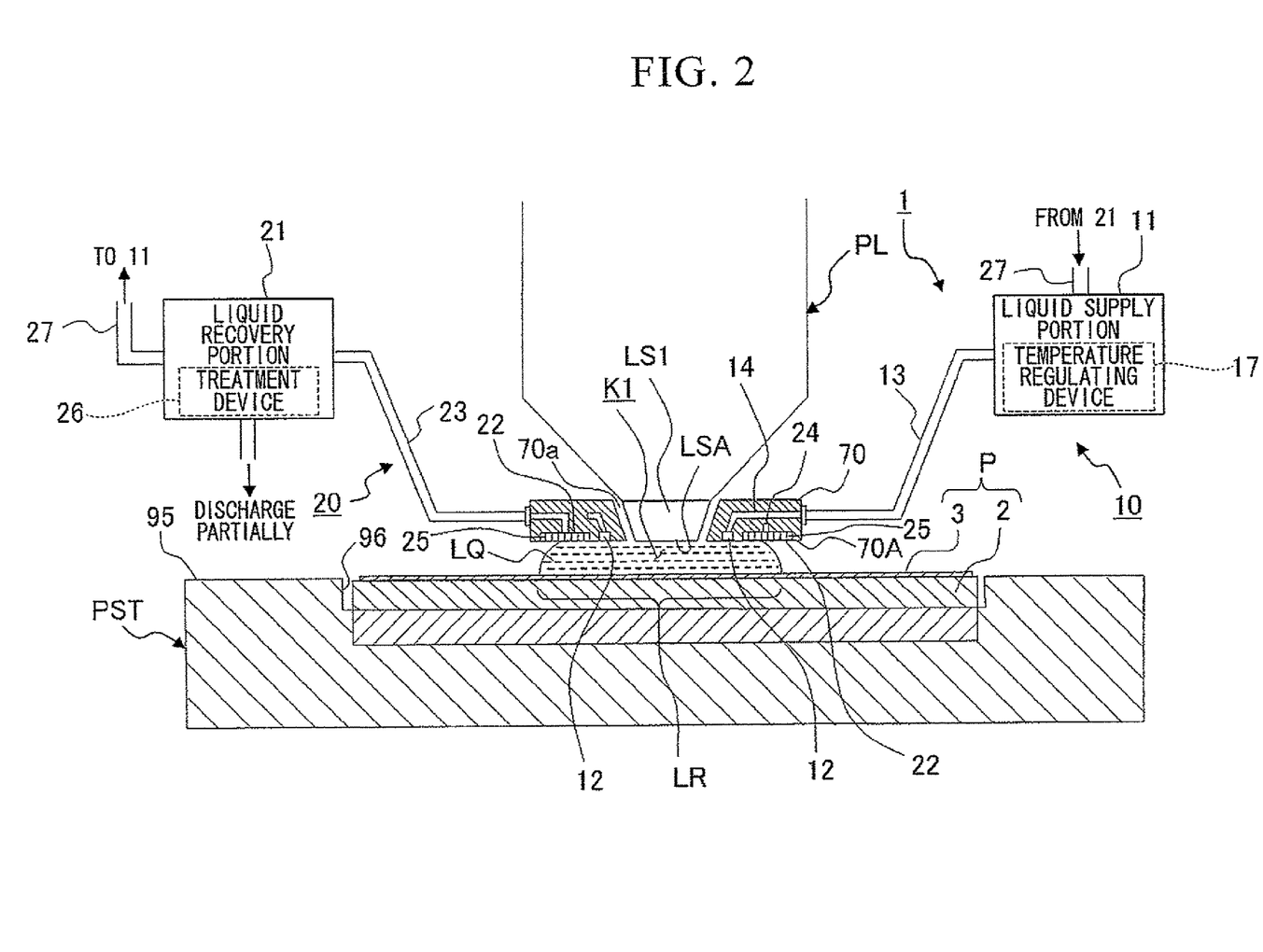
FIG. 2 is a partially enlarged view of the exposure apparatus according to the embodiment.

First, the member to be cleaned in the embodiment will be described with reference to FIGS. 1 and 2. FIG. 1 is a schematic configuration diagram of a liquid immersion exposure apparatus EX, and FIG. 2 is an enlarged view showing the vicinity of the front end of the image plane side of a projection optical system PL. In FIGS. 1 and 2, the exposure apparatus EX includes a mask stage MST capable of moving while mainly holding a mask M, a substrate stage PST capable of moving while holding a substrate P, an illumination optical system IL that illuminates the mask M held on the mask stage MST with exposure light EL, the projection optical system PL that projects a pattern image of the mask M illuminated with the exposure light EL upon the substrate P held on the substrate stage PST, and a controller CONT that controls the whole operation of the exposure apparatus EX as a whole. This exposure apparatus EX adopts a step and scan method in which the substrate stage PST and the mask stage MST are synchronously moved in a scanning direction (X direction) with respect to the exposure light EL at the time of exposure.

The exposure apparatus EX is a liquid immersion exposure apparatus to which a liquid immersion method is applied in order to improve resolution by substantially making the exposure wavelength short and to substantially widen the depth of focus. The exposure apparatus EX includes a liquid immersion mechanism 1 for filling a light path space K1 of the exposure light EL in the image plane side of the projection optical system PL with liquid LQ. The liquid immersion mechanism 1 includes a nozzle member 70, provided in the image plane vicinity of the projection optical system PL, that has a supply port 12 for supplying the liquid LQ and a recovery port 22 for recovering the liquid LQ, a liquid supply mechanism 10 that supplies the liquid LQ to the image plane side of the projection optical system PL via the supply port 12 provided in the nozzle member 70, and a liquid recovery mechanism 20 that recovers the liquid LQ of the image plane side of the projection optical system PL via the recovery port 22 provided in the nozzle member 70. The nozzle member 70 is disposed in the vicinity of a first optical element LS1 nearest to the image plane of the projection optical system PL, among a plurality of optical elements constituting the projection optical system PL. The nozzle member 70 is a plate-shaped member in which an aperture 70a for receiving the first optical element LS1 in the center is formed. The supply ports 12 are disposed in both sides of the aperture 70a in a scanning direction (X direction). A pair of recovery ports 22 is provided so as to be located at a position separated from the supply ports 12 with respect to the aperture 70a and to face each other with respect to the aperture 70a. A porous member 25 formed in a mesh filter shape is fitted in the recovery port 22.

The exposure apparatus EX is configured to fill the light path space K1, which is located between the lower surface LSA of the first optical element LS1 nearest to the image plane of the projection optical system PL and the upper surface of the substrate P disposed in the image plane side of the projection optical system PL, with the liquid LQ. In addition, the exposure apparatus EX illuminates the substrate P with the exposure light EL passing through the mask M via the liquid LQ located between the projection optical system PL and the substrate P and the projection optical system PL. Hereby, the pattern image of the mask M is projected on the substrate P. The controller CONT supplies the liquid LQ on the substrate P by a predetermined amount using the liquid supply mechanism 10, and recovers the liquid LQ on the substrate P by a predetermined amount using the liquid recovery mechanism 20, to thereby cause a liquid immersion region LR of the liquid LQ to be locally formed on the substrate P. In the embodiment, pure water is used as the liquid (liquid immersion liquid) LQ by which the liquid immersion region LR is formed.

In the embodiment, ArF excimer laser light is used as the exposure light EL emitted from the illumination optical system IL. In the embodiment, the first optical element LS1 is formed of fluorite.

The nozzle member 70 of the liquid immersion mechanism 1 is supported via a support mechanism 140 by a main column 100. The support mechanism 140 is configured to support the nozzle member 70 in the predetermined positional relationship to the projection optical system PL. The support mechanism 140 supports the nozzle member 70 so that a predetermined gap is formed between the first optical element LS1 and the nozzle member 70.

The nozzle member 70 includes the supply port 12 for supplying the liquid LQ and the recovery port 22 for recovering the liquid LQ. A plurality of supply ports 12 and a plurality of recovery ports 22 are formed in the lower surface 70A of the nozzle member 70. The lower surface 70A of the nozzle member 70 is provided in a position where the upper surface of the substrate P and the upper surface 95 of the substrate stage PST are able to face each other.

The nozzle member 70 according to the embodiment is formed of titanium. Similarly to the first optical element LS1, the nozzle member 70 is also in contact with the liquid LQ filled in the light path space K1. By using titanium, it is possible to satisfactorily adhere the lower surface (liquid contact surface) 70A of the nozzle member 70 and the liquid LQ closely to each other, and to satisfactorily form the liquid immersion region LR between the substrate P and the nozzle member. In addition, it is possible to positively fill the light path space K1 located between the first optical element LS1 and the substrate P with the liquid LQ.

The liquid supply mechanism 10 supplies the liquid LQ to the image plane side of the projection optical system PL via the supply port 12 of the nozzle member 70. The liquid supply mechanism 10 includes, in addition to the nozzle member 70, a liquid supply portion 11 capable of sending out the liquid LQ, and a supply tube 13 of which one end is connected to the liquid supply portion 11. These members may be also formed of titanium or a titanium alloy. The other end of the supply tube 13 is connected to the nozzle member 70.

The liquid supply portion 11 includes a pure water manufacturing device, a temperature regulating device that regulates temperature of the liquid (pure water) LQ to be supplied, a tank that receives the liquid LQ, a pressurizing pump, a filter unit that removes foreign substances within the liquid LQ and the like. In FIGS. 1 and 2, a temperature regulating device 17 is shown as an example. The liquid supply operation of the liquid supply portion 11 is controlled by the controller CONT.

The liquid recovery mechanism 20 is a mechanism for recovering the liquid LQ of the image plane side of the projection optical system PL via the recovery port 22 of the nozzle member 70. The liquid recovery mechanism 20 includes, in addition to the nozzle member 70, a liquid recovery portion 21 capable of recovering the liquid LQ, and a recovery tube 23 of which one end is connected to the liquid recovery portion 21. These members can be also formed of titanium or a titanium alloy. The other end of the recovery tube 23 is connected to the nozzle member 70.

The liquid recovery portion 21 includes a vacuum system (suction device) such as, for example, a vacuum pump, a gas-liquid separator that separates the recovered liquid LQ and gas, a tank that receives the recovered liquid LQ and the like.

In addition, the liquid recovery mechanism 20 includes a treatment device 26 that performs a predetermined treatment on the recovered liquid LQ. The treatment device 26 is a device for cleaning the recovered liquid LQ, and includes, for example, a filter unit, a distillation device and the like. The liquid recovery mechanism 20 returns the liquid LQ treated by the treatment device 26 to the liquid supply mechanism 10 via a return tube 27. The exposure apparatus EX in the embodiment includes a circulation system that circulates the liquid LQ between the liquid supply mechanism 10 and the liquid recovery mechanism 20. The liquid LQ recovered by the liquid recovery mechanism 20 is returned to the liquid supply portion 11 of the liquid supply mechanism 10.

Here, the substrate P will be described with reference to FIG. 2. The substrate P includes a base material 2, and a photosensitive material 3 coated on the upper surface of the base material 2. The base material 2 includes, for example, a silicon wafer (semiconductor wafer). The photosensitive material 3 is coated on a region occupying most of the central portion of the upper surface of the base material 2 by a predetermined thickness (for example, 200 nm or so).

When the substrate P and the liquid LQ of the liquid immersion region LR contact with each other, a portion of constituents of the substrate P is eluted to the liquid LQ. For example, when a chemically-amplified resist and a topcoat formed thereon are employed as the photosensitive material 3, the chemically-amplified resist includes a base resin, a Photo Acid Generator (PAG) included in the base resin, and an amine-based substance called a quencher. In addition, the topcoat includes water-shedding fluorocarbon. When such a photosensitive material 3 contacts the liquid LQ, fluorocarbon which is a topcoat constituent is eluted in the liquid LQ. Further, other constituents of the photosensitive material 3, particularly the PAG, the amine-based substance and the like are eluted in the liquid LQ. In addition, even when the base material 2 and the liquid LQ are contacted with each other, there is a possibility that a portion of constituents (silicon) of the base material 2 is eluted in the liquid LQ due to the substances constituting the base material 2.

As described above, the liquid LQ contacted with the substrate P includes contaminants generated from the substrate P. Further, there is a possibility that the liquid LQ may include contaminants (including gas) in the atmosphere. Thus, the liquid recovery mechanism 20 cleans a portion of the recovered liquid LQ in the treatment device 26, and then returns the cleaned liquid LQ to the liquid supply mechanism 10. In the embodiment, the liquid recovery mechanism 20 does not return the portion of the remainder of the recovered liquid LQ to the liquid supply mechanism 10, but discharges (discards) it to the outside of the exposure apparatus EX via a discharge tube 28. The liquid LQ returned to the liquid supply portion 11 of the liquid supply mechanism 10 is purified by the pure water manufacturing device, and then is supplied again to the light path space K1 of the image plane side of the projection optical system PL. The liquid supply mechanism 10 supplies the liquid LQ returned from the liquid recovery mechanism 20 again to the image plane side of the projection optical system PL, and reuses it for the purpose of liquid immersion exposure.

The controller CONT supplies the liquid LQ on the substrate P by a predetermined amount using the liquid supply mechanism 10, and recovers the liquid LQ on the substrate P by a predetermined amount using the liquid recovery mechanism 20, to thereby cause a liquid immersion region LR of the liquid LQ to be locally formed on the substrate P. When the liquid immersion region LR of the liquid LQ is formed, the controller CONT drives each of the liquid supply portion 11 and the liquid recovery portion 21. When the liquid LQ is sent out from the liquid supply portion 11 based on the control of the controller CONT, the liquid LQ sent out from the liquid supply portion 11 flows through the supply tube 13, and then is supplied from the supply port 12 to the image plane side of the projection optical system PL via a supply channel 14 of the nozzle member 70. In addition, when the liquid recovery portion 21 is driven based on the controller CONT, the liquid LQ of the image plane side of the projection optical system PL flows into a recovery channel 24 of the nozzle member 70 via the recovery port 22, and flows through the recovery tube 23, and then is recovered in the liquid recovery portion 21.

Figure 5:
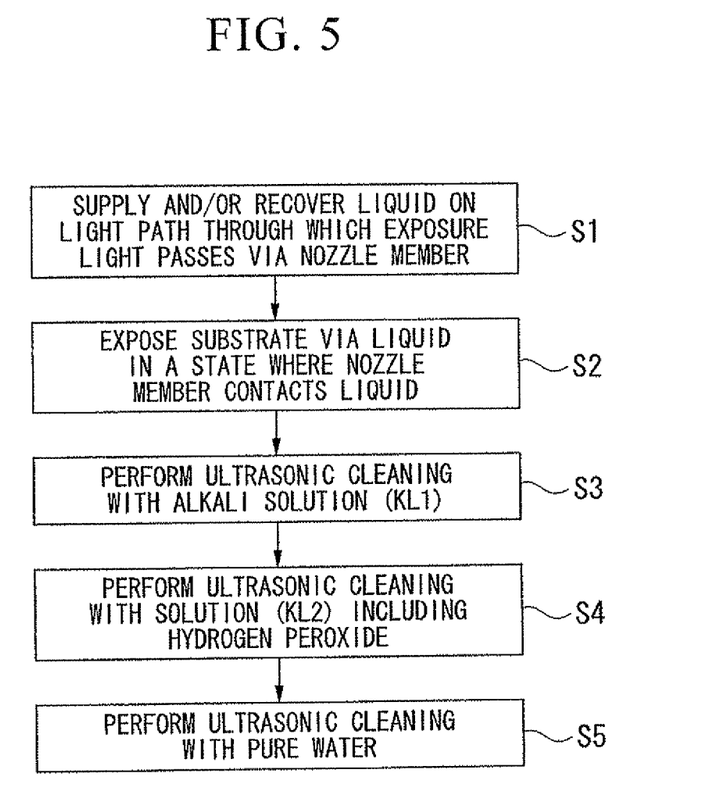
FIG. 5 is a flowchart illustrating an exposure method according to the embodiment.

Here, a method of performing the liquid immersion exposure on the substrate P using the above-mentioned exposure apparatus EX will be described with reference to FIG. 5. The controller CONT controls the liquid immersion mechanism 1 and fills the light path space K1 of the exposure light EL, located between the projection optical system PL and the substrate P, with the liquid LQ via the nozzle member 70 to thereby form the liquid immersion region LR of the liquid LQ on the substrate P (step S1). The controller CONT controls the illumination optical system IL, the mask stage MST and the substrate stage PST, and illuminates the substrate P with the exposure light EL passing through the mask M via the liquid LQ located between the projection optical system PL and the substrate P and the projection optical system PL to thereby project the pattern image of the mask M on the substrate P by the step and scan method (step S2).

During the liquid immersion exposure, or before or after it, as shown in FIG. 2, the liquid LQ is filled in the space including the light path space K1 of the exposure light EL located between the lower surface (liquid contact surface) LSA of the first optical element LS1 and the lower surface (liquid contact surface) 70A of the nozzle member 70, and the substrate P. That is, the liquid LQ contacts the substrate P, and also contacts the lower surface LSA of the first optical element LS1, the lower surface 70A of the nozzle member 70 and the like.

As described above, the liquid LQ contacting the substrate P includes contaminants generated from the substrate P and the like. Therefore, when the liquid LQ including the contaminants contacts the nozzle member 70, the contaminants in the liquid LQ adhere to the nozzle member 70, to thereby cause the nozzle member 70 to be contaminated. In particular, it is easy for the contaminants to adhere to the vicinity of the recovery port 22 of the nozzle member 70, the porous member 25 and the recovery channel 24. When the state of the adhered impurities is left as it is, the recovery operation of the liquid LQ not only becomes unstable, but also contacts the contaminated nozzle member 70 and the like, to thereby cause the supplied liquid LQ to be contaminated even though the clean liquid LQ is supplied to the light path space K1.

Consequently, in the embodiment, the nozzle member 70 including the porous member 25 is cleaned. Hereinafter, a method (maintenance method) of cleaning the nozzle member 70 will be described.

In the embodiment, the nozzle member 70 is cleaned in a state where it is supported by the support mechanism 140. Hereby, it is possible to clean the nozzle member 70 without performing a removal operation of the nozzle member 70. In addition, since the removal operation after cleaning (after maintenance) is not required to be performed, it is possible to improve the operability of the maintenance operation (cleaning operation), and to shorten the operation time.

Figure 3:
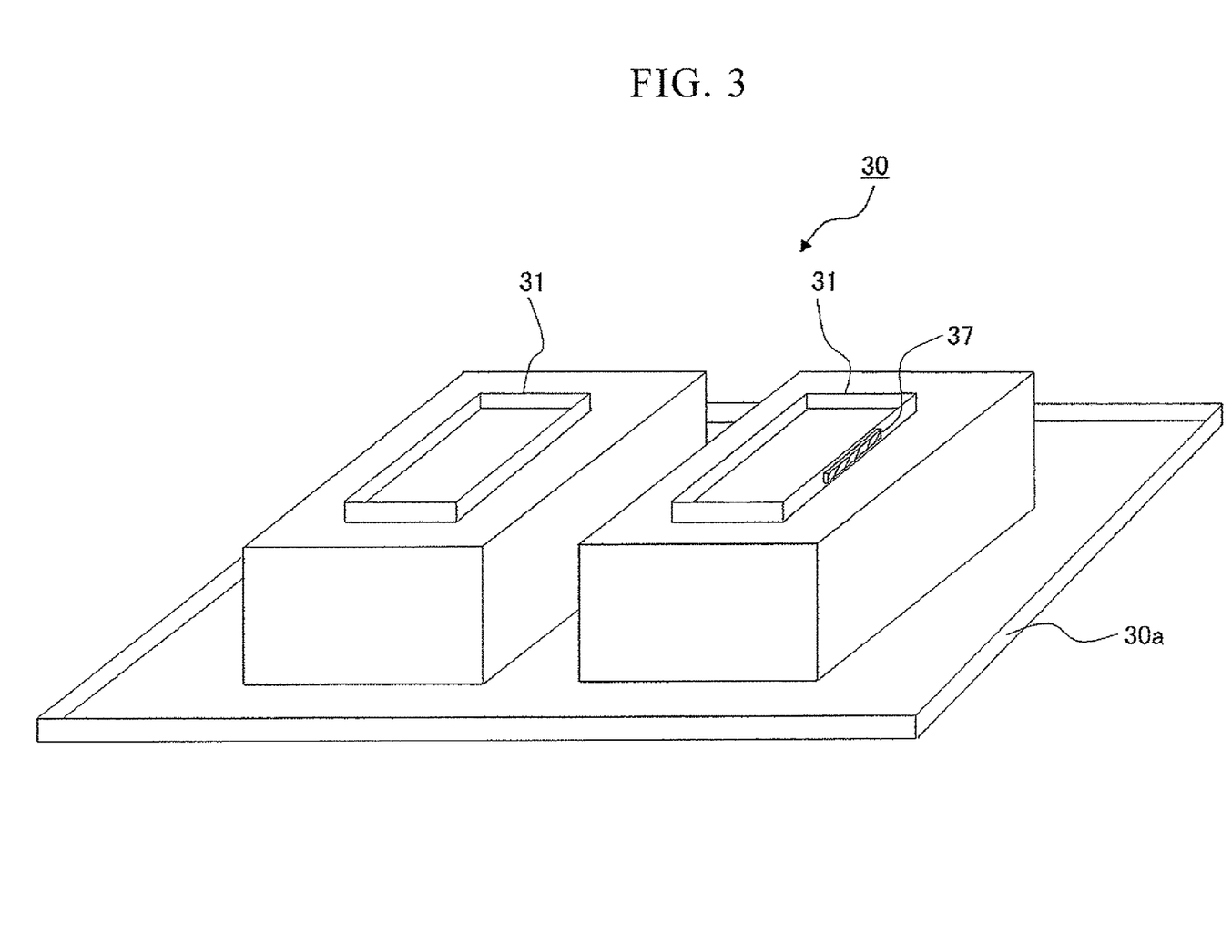
FIG. 3 is a diagram illustrating a maintenance mechanism according to the embodiment.
Figure 4:
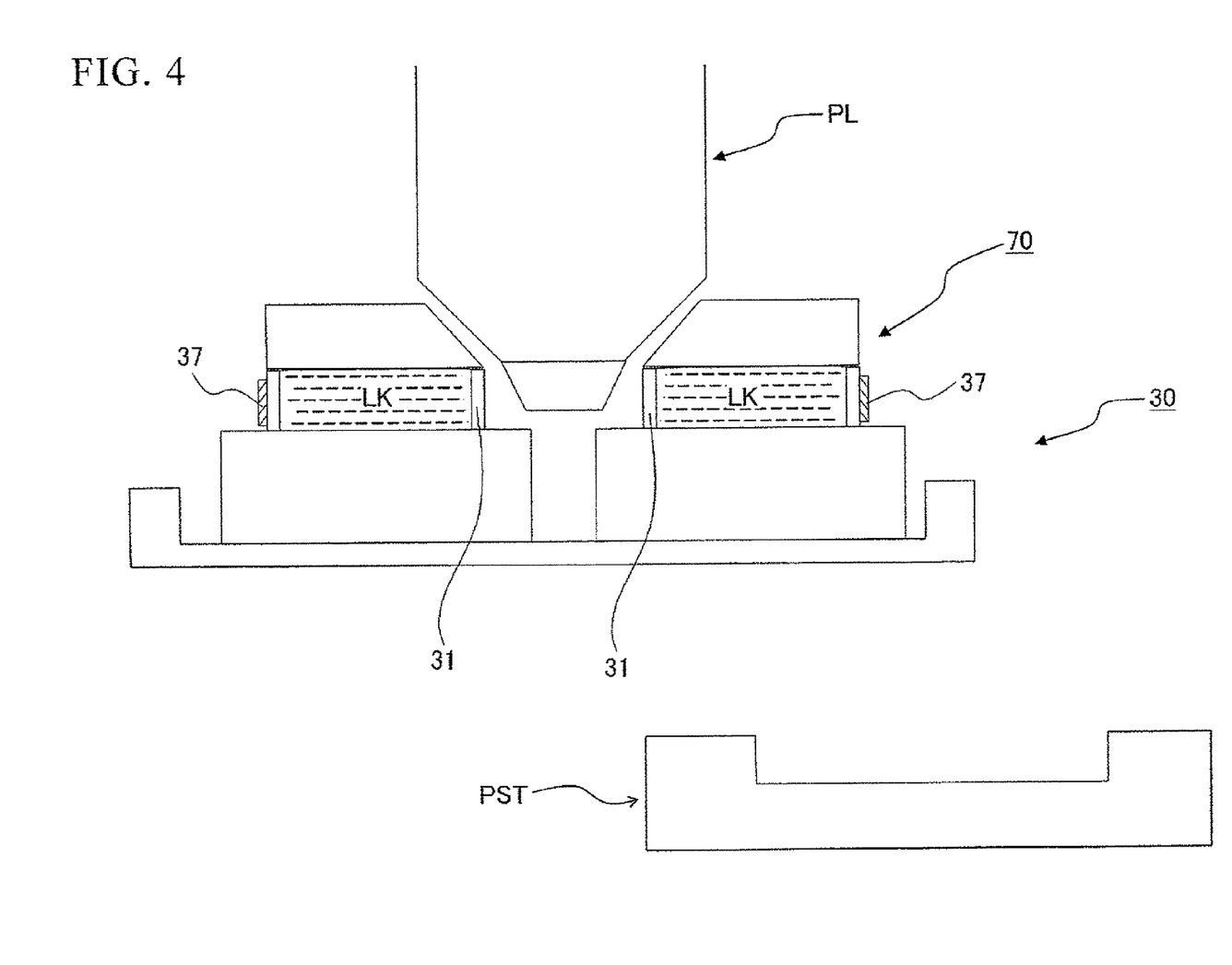
FIG. 4 is a conceptual diagram illustrating a usage state of the maintenance mechanism according to the embodiment.

A maintenance mechanism 30 that cleans the nozzle member 70 is shown in FIG. 3. The maintenance mechanism 30 includes a pair of containers 31 that receive cleaning liquid LK1 or LK2 on a plate 30a. A pair of containers 31 are separated by a predetermined distance in response to a position in which the supply port 12 and the recovery port 22 of the nozzle member 70 are provided. At the time of cleaning the nozzle member 70, the first optical element LS1 of the projection optical system PL or the aperture 70a of the nozzle member 70 is disposed between a pair of containers 31. By such a disposition, it is possible to prevent that the first optical element LS1 contacts the cleaning liquid LK1 or LK2, so that it is possible to prevent damage. In addition, an ultrasonic generator 37 is provided in the container 31, so that it is possible to apply ultrasonic waves to the cleaning liquid at the time of cleaning.

The present inventor has found that the surface of the member is effectively purified by sequentially performing the cleaning in two steps of first cleaning the member with an alkali solution (hereinafter, appropriately referred to as "alkali solution cleaning process"), and subsequently cleaning it with a solution including hydrogen peroxide (hereinafter, appropriately referred to as "hydrogen peroxide cleaning process"), in order to clean the member which is in contact with liquid (hereinafter, appropriately referred to as "liquid immersion liquid") at the time of the liquid immersion exposure. Consequently, in the embodiment, the alkali solution cleaning process is first performed.

Alkali Solution Cleaning Process

Contaminants adhering to the nozzle member chiefly include organic compounds generated from a photoresist layer or a topcoat layer formed on the substrate to be exposed. The specific contaminants include a base resin of the photoresist, a Photo Acid Generator (PAG) included in the base resin, an amine-based substance called a quencher and the like, or water-shedding fluorocarbon used as a topcoat and the like. In particular, since the topcoat is in direct contact with the liquid immersion liquid, it is easy for constituents of the topcoat to adhere to the nozzle member via the liquid immersion liquid. The organic contaminants generated from the topcoat and the like dissolve in an alkali solution such as, for example, an etching solution of the photoresist. Consequently, in the embodiment, the organic contaminants are removed from the nozzle member by first cleaning them with an alkali solution.

In the embodiment, it is possible to use, as an alkali solution, a solution of inorganic compounds such as sodium hydroxide and potassium hydroxide, or a solution of organic compounds such as tetramethylammonium hydroxide and trimethyl (2-hydroxyethyl)ammonium hydroxide. As an example, it is possible to use tetramethylammonium hydroxide. Since the tetramethylammonium hydroxide is generally used as a developer of the photoresist at the semiconductor factory, it is easily available. The tetramethylammonium hydroxide does not include alkali metal elements having an adverse effect on the semiconductor device, and does not corrode the periphery thereof. It is possible to use, as a solvent of these solutions, pure water with a high purity level used at a semiconductor factory.

Next, the cleaning method of the nozzle member 70 in the alkali solution cleaning process will be described with reference to FIG. 5. Here, an aqueous solution of tetramethylammonium hydroxide is used as the cleaning liquid LK1.

After the liquid immersion exposure is terminated, the substrate stage PST is withdrawn from the downside of the projection optical system PL. The aqueous solution of tetramethylammonium hydroxide as the cleaning liquid LK1 is previously filled in the container 31. Next, the maintenance mechanism 30 contacts the porous member 25 of the supply port 12 and the recovery port 22 of the nozzle member 70 with the aqueous solution of tetramethylammonium hydroxide within the container 31, or is disposed in the downside of the projection optical system PL so as to be partially immersed. Next, an ultrasonic apparatus 37 of the maintenance mechanism 30 is put into operation to apply ultrasonic waves to the cleaning liquid LK1, and this state is continued for ten minutes (step 3). It is considered that by applying ultrasonic waves, the cleaning liquid pervades even the insides of holes of the porous member 25, and the cleaning effect becomes more effective through the liquid vibration or pressure fluctuation action of ultrasonic waves thereby allowing cleaning time to be shortened.

When the contaminated member is cleaned with the above-mentioned alkali solution, the main contaminants are removed, whereby it appears clean to the naked eye. However, when the member is mounted in the exposure apparatus again after cleaning, and is put into operation under typical conditions, re-adhesion of the contaminants begins soon after the alkali solution cleaning. On the other hand, when an unused member that is mounted in the exposure apparatus undergoes an exposure operation under the same conditions, it is possible to suppress re-adhesion of the contaminants for a considerably long time, for example, as long as one month. From this comparison, it is known that a surface state of the member which is cleaned once with the alkali solution is different from that of an unused member, and the surface of the member changes into a surface to which the contaminants adhere very easily. As a cause of such a phenomenon, it is considered that since there is a high affinity between the alkali solution and the member to be cleaned, the alkali solution remains in the surface of the member even after cleaning, and photoresist-derived contaminants such as the topcoat are dissolved in the remaining alkali solution and adhere to the surface of the member.

In the embodiment, the above-mentioned alkali solution cleaning process is carried out, followed by a hydrogen peroxide cleaning process to be described below.

Meanwhile, when the alkali solution cleaning process is terminated in the embodiment, the alkali solution within the container 31 is discharged once, and then pure water is supplied to the container 31, whereby the alkali solution adhered to the container 31 or the nozzle member 70 can be removed. It is possible to more reliably achieve the effect of the hydrogen peroxide cleaning process by removing the alkali solution before the hydrogen peroxide cleaning process.

Hydrogen Peroxide Cleaning Process

In the hydrogen peroxide cleaning process according to the embodiment, the cleaning liquid LK1 of the container 31 of the maintenance mechanism 30 is exchanged for the solution LK2 including hydrogen peroxide, the cleaning liquid LK2 and the nozzle member 70 contact each other, or the nozzle member 70 is partially immersed in the cleaning liquid LK2, and the nozzle member 70 is cleaned by applying ultrasonic waves, for example, for five minutes. At this time, an aqueous solution of hydrogen peroxide can be used as the solution LK2 including hydrogen peroxide. The concentration of hydrogen peroxide in the solution LK2 can be set to, for example, approximately 0.05, 0.1, 0.5, 1.0, 5.0, 10.0, 15.0, 20.0, 25.0, or greater than or equal to 30.0 wt %. From the standpoint of the ability of removing the alkali solution, the concentration of hydrogen peroxide in the solution LK2 can exceed 0.1 wt %, or be 0.5 wt % or more. The application time of ultrasonic waves can be variously changed in response to the cleaning condition.

The alkali solution remaining in the surface of the member to be cleaned is removed almost completely by cleaning using the hydrogen peroxide solution. The reason thereof is not clear at the current time, but particularly when an organic alkali solution is used as an alkali solution, it is presumed that the organic alkali is resolved and removed by the oxidation action of hydrogen peroxide.

After the above-mentioned hydrogen peroxide cleaning process is terminated, the cleaning liquid LK2 of the container 31 of the maintenance mechanism 30 is exchanged for the pure water, the pure water and the nozzle member 7 contact each other, or the nozzle member 70 is immersed in the pure water, ultrasonic waves are applied for thirty minutes (step S5). Cleaning (rinsing) with the pure water removes the cleaning liquid LK2, and contacts the pure water which is also used as liquid immersion liquid with each of the members, to thereby allow the next exposure circumstances to be adjusted.

After cleaning with the pure water is completed, the liquid immersion region LR of the liquid LQ is formed again (step S1). The pattern image of the mask M is projected on the substrate P using the step and scan method by illuminating the substrate P with the exposure light EL passing through the mask M via the liquid LQ and the projection optical system PL (step S2).

According to the cleaning method of the embodiment, it is possible to reliably remove the contaminants adhered to the nozzle member, and further to prevent the alkali solution from remaining in the surface of the member. Therefore, when the member after cleaning is provided to the liquid immersion exposure again, it is possible to extend the period until cleaning due to re-adhesion of the contaminants is required once again. At this time, particularly when the nozzle member is a member made of titanium, or a member made of a titanium alloy, the titanium and the titanium alloy particularly have a high affinity for the alkali solution, and thus it is possible to clearly obtain the effect of the hydrogen peroxide cleaning process, and to prevent re-adhesion of the contaminants for a long period of time.

In addition, according to the exposure method of the embodiment, since the member which is in contact with the liquid immersion liquid of the exposure apparatus can be maintained cleanly, it is possible to prevent the liquid immersion liquid which is in contact with the member from being contaminated. As a result, it is possible to prevent the mask pattern image from deteriorating, and to maintain the desired exposure accuracy.

Figure 6:
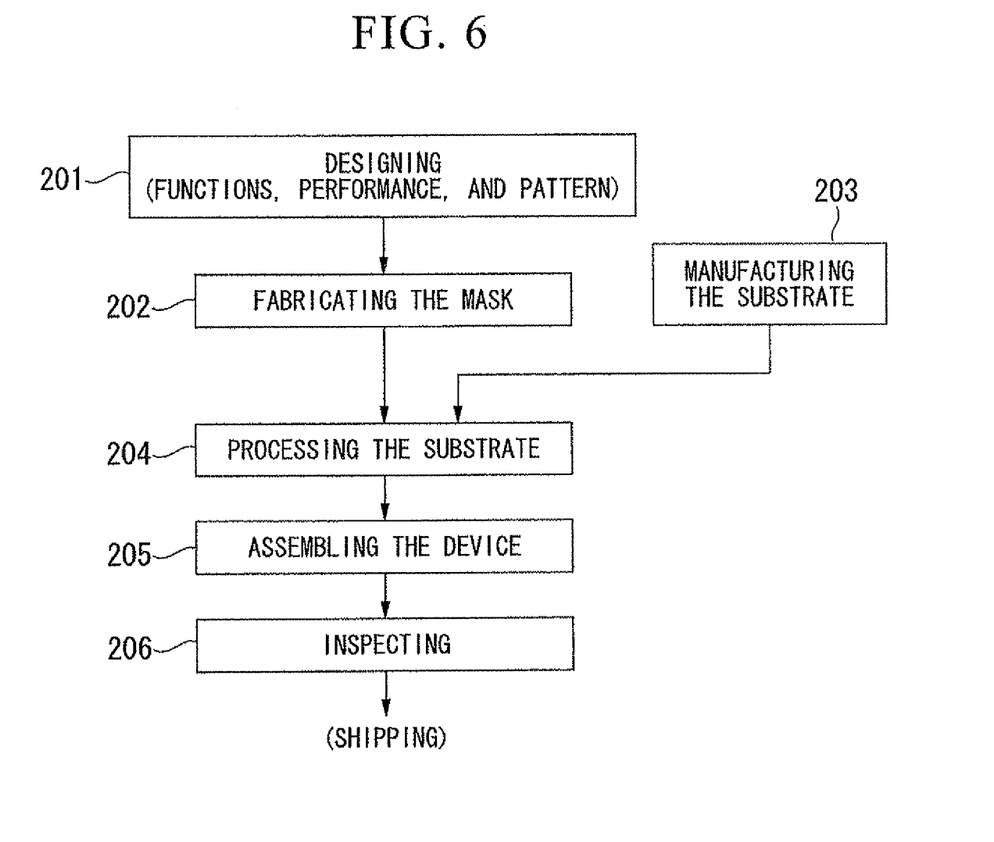
FIG. 6 is a flowchart illustrating a device manufacturing method according to the embodiment.

As shown in FIG. 6, a micro device such as a semiconductor device is manufactured through step 201 of performing the function and performance design of the micro device, step 202 of manufacturing a mask (reticle) based on this design step, step 203 of manufacturing a substrate which is a base material of the device, step 204 of processing the substrate including a step of exposing the substrate with the exposure light from the mask and a step of developing the exposed substrate in accordance with the embodiment described above, step 205 (including processes such as a dicing process, a bonding process, and a packaging process) of constructing the device, and inspection step 206. The exposure method in the exposure apparatus EX described in the embodiment is included in substrate processing step 204, and the step of exposing the substrate P is performed by the exposure method.

Meanwhile, it is possible to apply not only the semiconductor wafer for manufacturing the semiconductor device, but also a glass substrate for a display device, a ceramic wafer for a thin-film magnetic head, or an original plate (synthetic quartz, silicon wafer) of the mask or the reticle used in the exposure apparatus, to the substrate P of the above-mentioned embodiment.

In the embodiment of the present invention as described above, the nozzle member 70 including the porous member 25 is used as a member to be cleaned which is in contact with the liquid immersion liquid; however, the invention is not limited thereto. In addition to that, for example, the supply tube and the recovery tube of the liquid to be connected to the nozzle member can be cleaned.

Further, in the above-mentioned embodiment, the nozzle member is formed of titanium. Alternatively and/or additionally, the materials of the nozzle member can include a titanium alloy, stainless steel, or a nickel alloy and the like.

Further in the above-mentioned embodiment, cleaning of the nozzle member is performed using the cleaning liquid LK1, the cleaning liquid LK2 and the pure water. Alternatively and/or additionally, cleaning (rinsing) with the pure water can be performed by making the pure water used as the liquid immersion liquid LQ flow through the liquid supply portion 11 and the liquid recovery portion 21 before the exposure.

In the above-mentioned embodiment, the nozzle member 70 is cleaned in the cleaning process using the cleaning liquid LK1, the cleaning liquid LK2 and the pure water while applying ultrasonic waves to these liquids; however, it is possible to omit the application of ultrasonic waves in any of or all of the processes.

In the above-mentioned embodiment, after the liquid immersion exposure is terminated, the nozzle member 70 is cleaned without removing the nozzle member 70 from the exposure apparatus EX, that is, in a state where the nozzle member is mounted in the exposure apparatus EX. Alternatively, it is possible to remove the nozzle member 70 from the exposure apparatus EX to clean only the nozzle member. Further, in the above-mentioned embodiment, the nozzle member 70 is contacted with the cleaning liquid filled in the maintenance mechanism 30 or immersed in the cleaning liquid to perform the cleaning. Alternatively, the cleaning liquid can be ejected directly into the nozzle member to clean it. Additionally, at the time of cleaning, the cleaning liquid can be circulated through the liquid supply portion 11 and the liquid recovery portion 21. In this case, the cleaning liquid can also be circulated instead of the liquid LQ without using the maintenance mechanism 30.

The structure of the liquid immersion mechanism 1 of the nozzle member 70 and the like is not limited to the above-mentioned structure, and, for example, it can use structures disclosed in EP Patent Publication No. 1420298, PCT International Publication No. WO 2004/055803, PCT International Publication No. WO 2004/057590, and PCT International Publication No. WO 2005/029559. Particularly, in the above-mentioned embodiment, a structure where the supply port 12 and the recovery port 22 are, respectively, provided in both sides of the aperture 70a in a scanning direction is shown as a structure of the nozzle member. Alternatively, the structure of the nozzle member may be a structure where the recovery port 22 is formed surrounding the aperture 70a, as disclosed in, for example, PCT International Publication No. WO 2004/086468, PCT International Publication No. WO 2004/105106 and PCT International Publication No. WO 2005/067013.

In the above-mentioned embodiment, the pure water is used as the liquid immersion liquid. Alternatively, it is possible to use liquid obtained by adding (mixing) liquid different from the pure water to the pure water as the liquid immersion liquid. Further, the liquid immersion liquid may be liquid obtained by adding (mixing) bases or acids such as $H^+$, $Cs^+$, $H^+$, $Cl^-$, $SO_4^{2-}$, and $PO_4^{2-}$ to the pure water, and may also be liquid obtained by adding (mixing) corpuscles such as an Al oxide to the pure water. Meanwhile, as the liquid immersion liquid, it is possible to use liquid having a small absorption coefficient of light and a low temperature dependence, and to use stable liquid with respect to the photosensitive material (or the topcoat film, the antireflective film and the like) applied to the projection optical system PL and/or the surface of the substrate P.

In the above-mentioned embodiment, although a step and scan type exposure method of synchronously moving the substrate and the mask with respect to the exposure light has been described as an example, a step and repeat type exposure method of collectively exposing the substrate can be used. Further, in the liquid immersion exposure, although a local liquid immersion (Local filling) method of forming a liquid immersion region only in a portion of the region of the substrate has been described as an example, it is also possible to adopt a projection optical system in which even the light path space of the mask side of the tip optical element is filled with liquid, as disclosed in, for example, PCT International Publication No. WO 2004/019128. In addition, the present invention can also be applied to a liquid immersion type exposure method of holding the liquid immersion region located between the projection optical system and the substrate with an air curtain of the periphery thereof. In addition, the exposure method of the invention can also be applied to a twin stage system in which a plurality of stages as disclosed in a tandem type stage system having a wafer stage and a measurement stage or U.S. Pat. No. 6,208,407 moves an exposure section and a measurement section.

EXPERIMENTAL EXAMPLE

A titanium thin plate having a clean surface was prepared, and a cleaning experiment was performed under the following conditions.

Samples 1 to 9 were cleaned with a TMAH aqueous solution (concentration 2.38 wt %) for ten minutes, subsequently cleaned with the pure water for thirty minutes, further cleaned with an aqueous solution of hydrogen peroxide ($H_2O_2$) having a predetermined concentration for ten minutes, and cleaned once again with the pure water for thirty minutes and then dried. The hydrogen peroxide concentration of the aqueous solution applied to each of the samples 1 to 9 is as shown in Table 1. On the other hand, samples 10 and 11 were cleaned with the TMAH aqueous solution having the same concentration as that of the samples 1 to 9 for ten minutes, and cleaned directly with the pure water for thirty minutes without performing cleaning with the aqueous solution of hydrogen peroxide, and then dried. Meanwhile, ultrasonic irradiation was performed in all the cleaning processes with respect to all the samples 1 to 11.

TABLE 1

| SAMPLE | No. 1 | No. 2 | No. 3 | No. 4 | No. 5 | No. 6 | No. 7 | No. 8 | No. 9 | No. 10 | No. 11 |
|---|---|---|---|---|---|---|---|---|---|---|---|
| CONCENTRATION OF HYDROGEN PEROXIDE (wt %) | 0.1 | 0.1 | 0.5 | 0.5 | 1.0 | 1.0 | 5.0 | 5.0 | 30 | — | — |
| RATIO OF IONIC STRENGTH OF $C_4H_{12}N^+$ TO ALL THE POSITIVE IONS | 0.50 | 0.48 | 0.010 | 0.017 | 0.009 | 0.004 | 0.016 | 0.007 | 0.006 | 0.57 | 0.48 |

Figure 7:
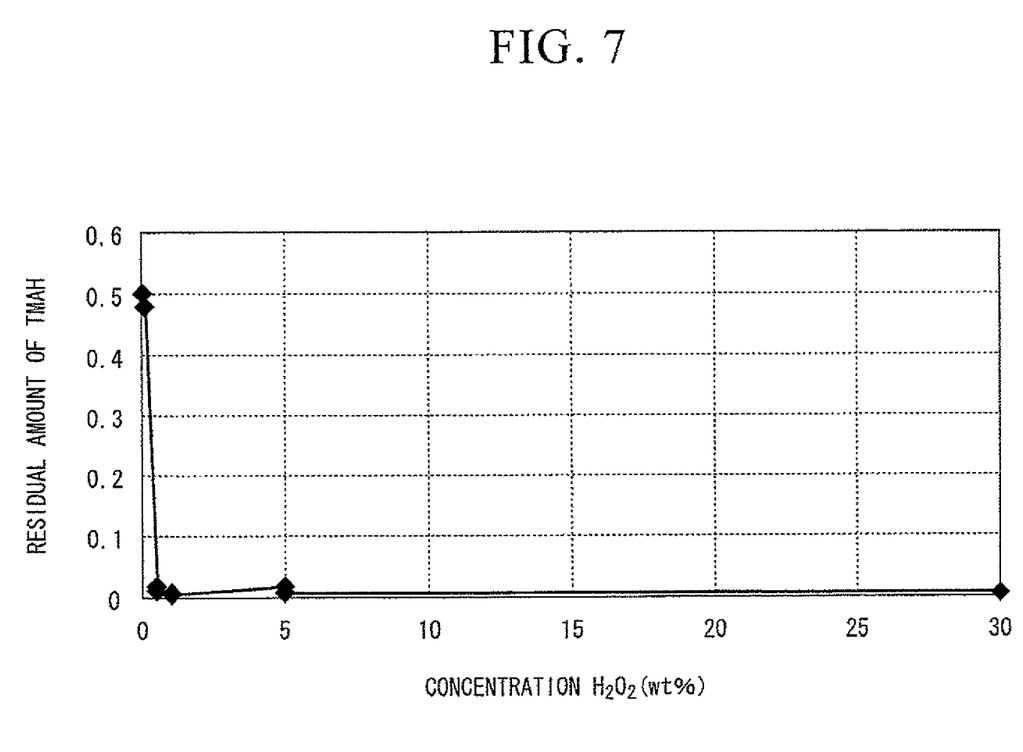
FIG. 7 is a graph illustrating a result of a cleaning test according to an example.

The amount of TMAH remaining in each of the surfaces was analyzed by TOF-SIMS (time-of-flight secondary ion mass spectrometry) with respect to each of the samples cleaned in the above-mentioned conditions. The residual amount of TMAH was estimated by a ratio of the ionic strength of $C_4H_{12}N^+$ to the strength of all the positive ions detected from the sample surface. The result thereof is shown in Table 1. From the analysis result shown in Table 1 and FIG. 7, it has been found that the amount of TMAH remaining in the sample surface is able to be considerably reduced by cleaning using the aqueous solution of hydrogen peroxide after the TMAH cleaning. In addition, when the concentration of hydrogen peroxide is at least 0.5% or more, it has been found that the residual amount of TMAH in the sample surface can be effectively reduced.

What is claimed is:

1. A method of cleaning a member, used at a time of exposing a substrate via liquid, which is in contact with the liquid, the method comprising:
    cleaning the member with an alkali solution; and
    after the cleaning with the alkali solution, removing the alkali solution from the member by cleaning the member with a solution including hydrogen peroxide, wherein a concentration of hydrogen peroxide in the solution including hydrogen peroxide is at least 15 wt %.

2. The cleaning method according to claim 1, wherein the member which is in contact with the liquid is a member made of titanium or a titanium alloy.

3. The cleaning method according to claim 1, wherein at least one of the cleaning with the alkali solution and the cleaning with the solution including hydrogen peroxide includes applying ultrasonic waves.

4. The cleaning method according to claim 1, wherein the member is a member mounted in an exposure apparatus that exposes the substrate via the liquid, and the cleaning steps are performed in a state where the member is mounted in the exposure apparatus.

5. The cleaning method according to claim 1, wherein the member is a member mounted in an exposure apparatus that exposes the substrate via the liquid, and the member is a porous member provided in a recovery port that recovers the liquid.

6. The cleaning method according to claim 1, wherein the alkali solution is a solution of tetramethylarnmonium hydroxide.

7. An exposure method comprising:
    exposing a substrate by illuminating a substrate with exposure light via liquid; and
    cleaning a member which is in contact with the liquid by using the cleaning method according to claim 1.

8. A device manufacturing method using the exposure method according to claim 7.

* * * * *